(12) United States Patent
Park et al.

(10) Patent No.: US 6,221,783 B1
(45) Date of Patent: Apr. 24, 2001

(54) METHOD OF MANUFACTURING A HETEROJUNCTION BIPOLAR TRANSISTOR

(75) Inventors: Sung Ho Park; Tae Woo Lee; Moon Pyung Park; Chul Soon Park, all of Daejon-Shi (KR)

(73) Assignee: Electronics and Telecommunications Research Institute, Daejon-shi (KR)

( * ) Notice: Subject to any disclaimer, the term of this patent is extended or adjusted under 35 U.S.C. 154(b) by 0 days.

(21) Appl. No.: 09/378,764

(22) Filed: Aug. 23, 1999

(30) Foreign Application Priority Data

Aug. 25, 1998 (KR) .................................. 98-34520

(51) Int. Cl.[7] .................................. H01L 21/00
(52) U.S. Cl. .................. 438/712; 438/713; 438/718; 438/720; 438/724
(58) Field of Search .................. 438/712, 713, 438/718, 720, 724, 737, 742, 744

(56) References Cited

U.S. PATENT DOCUMENTS

| 5,648,294 | * | 7/1997 | Bayaktaroglu | .................. 438/718 X |
| 5,672,522 | | 9/1997 | Streit et al. . | |
| 5,698,871 | | 12/1997 | Sakai et al. . | |

OTHER PUBLICATIONS

Guan–WU Wang, "Improved heterojunction bipolar transistor reliability with carbon–doped base", Appl. Phys. Lett 68, Feb. 5, 1996, pp. 809–811.

T. Kumar et al., "Ensemble Monte Carlo analysis of self–heating effects in graded heterojunction bipolar transistor", Journal of Applied Physics, vol. 83, No. 4, Feb. 15, 1998, pp. 1869–1877.

H.C. Tseng et al., "A high–current–gain, high–speed P–n–P AlGaAs/InGaAs/GAAs collector–up heterojunction bipolar transistor", Appl. Phys. Lett. 67, Aug. 7, 1995, pp. 837–839.

* cited by examiner

*Primary Examiner*—William Powell
(74) *Attorney, Agent, or Firm*—Jacobson, Price, Holman & Stern, PLC

(57) ABSTRACT

There is disclosed a method of manufacturing a heterojunction bipolar transistor. The method of manufacturing a heterojunction bipolar transistor can provide a high speed and high frequency characteristic of a transistor, which includes forming sequentially a buffer layer, a subcollector layer, a collector layer, a base layer, an emitter layer and a emitter cap layer on a semiconductor substrate; forming an emitter electrode a selected region of the emitter cap layer; performing etching process for forming a pattern by exposing the selected region of the base layer, and forming a polyimide layer on both side walls of the patternized emitter cap layer and the emitter layer; forming a base electrode at a selected region on the exposed base layer; performing etching process for forming a pattern by exposing some portions of the collector layer, and then forming a p-SiN film on both side walls of the patterned base layer and some portions of the collector layer; exposing some portions of the collector layer, etching the remaining collector layer and some portions of the subcollector layer with a inward slope, and then forming a collector electrode at a selected region of the remaining subcollector layer; and performing a thermal treatment process to make some of the patterned collector layer and the subcollector layer into an insulating region.

6 Claims, 6 Drawing Sheets

METHOD OF MANUFACTURING A HETEROJUNCTION BIPOLAR TRANSISTOR

BACKGROUND OF THE INVENTION

1. Field of the Invention

The present invention relates to a method of manufacturing a heterojunction bipolar transistor, and more particularly to a method of manufacturing a heterojunction bipolar transistor capable of effectively reducing a junction capacitance between the base and the emitter which greatly affects a maximum oscillation frequency, even in future applications where the size of devices is reduced to accomodate a very high speed characteristic.

2. Description of the Prior Art

As multimedia communication services such as internet, on-line game, home banking, etc. have developed rapidly, a need for transmitting various informations in high speed have been increased and thus communication system capable of handling this need have been rapidly developed. Therefore, it is essential to make core electronic elements to be mounted into the system with a very high speed and a very high frequency. A heterojunction bipolar transistor (referred below to HBT) is used for various digital and analog communication circuits as a very high speed and very high frequency element. In recent, it is known that a cut-off frequency $f_T$ and a maximum oscillation frequency $f_{max}$ are more than 100 GHz, respectively, for AlGaAs/GaAs or InGaP/GaAs HBT, and more than 200 GHz, respectively, for InP/InGaAs or InAlAs/InGaAs HBT. Upon comparing HBT with other semiconductor devices such as field effect transistor (FET), etc, the HBT is not limited by lithography technology and also has an unique high speed characteristic since it is based on the longitudinal control of electrons on a heterojunction epitaxial. However, in order to maximize these advantages, it is necessary that the time taken when electrons pass through the base and the collector depletion layers must be shorten, and the emitter, the base and the collector ohmic resistances must be reduced, and also effective processes for reducing the emitter-base capacitance, the base-collector capacitance, and various parasitic elements, etc. must be developed. As a method in which the above requirements are simply quantized, it may be expressed into the following equation, $f_{max}=(f_T/8\pi R_B C_{BC})^{1/2}$. Where $R_B$ represents the base resistance and $C_{BC}$ represents the base-collector junction capacitance. As can be seen from the above equation, if the base-collector junction capacitance $C_{BC}$ is reduced, $f_{max}$ which greatly affects a high speed characteristic of circuits can be substantially improved. As practical process technologies for reducing the external base-collector junction capacitance, undercutting of the external base region, ion injection isolation against the external base region and the external base regrowth, etc. have been used.

Now, the conventional methods for manufacturing these HBTs will be explained by reference to FIGS. 1 through 4.

FIGS. 1 through 4 are cross-sectional views for showing the method of manufacturing the conventional HBT.

FIG. 1 is a cross-sectional view showing a first embodiment of a conventional heterojunction bipolar transistor, which shows a structure of a device commonly used.

First, a buffer layer 10 is grown on a semiconductor substrate 1. Then, a subcollector layer 20, a collector layer 30, a base layer 40, an emitter layer 50 and an emitter cap layer 60 are sequentially grown on the buffer layer 10 to form a HBT structure. An emitter electrode 65 is then formed at a selected region on the HBT epitaxial substrate. Then a selected region of the emitter cap layer 60 and the emitter layer 50 is subjected to mesa-etching process to form a base electrode 55 at a selected region on the base layer 40. Then, the selected region of the base layer 40 and the collector layer 30 is subjected to mesa-etching process thereby to form a collector electrode 35 at a selected region on the subcollector layer 20. Finally, the resulting structure is subjected to isolation mesa-etching process. At this time, the collector electrode 35 is made of a different material from that of the emitter electrode 65 and the base electrode 55.

However, the above method never uses any technology for improving external parasitic resistance or capacitance.

FIG. 2 is a cross-sectional view showing a second embodiment of a conventional heterojunction bipolar transistor.

First, a buffer layer 110 is formed on a semiconductor substrate 100. Then, a subcollector layer 120, an epitaxial layer 120 (which acts as a barrier layer upon overetching) for selective etching, a collector layer 130, a base layer 140, an emitter layer 150 and an emitter cap layer 160 are sequentially grown on the buffer layer 110 to form a HBT structure. After an emitter electrode 165 is formed at a selected region on the HBT epitaxial substrate, a selected region on the emitter cap layer 160 and the emitter layer 150 is subjected to mesa-etching process thereby to form a base electrode 155 at a selected region on the base layer 140. After the selected region of the base layer 140 and the collector layer 130 is subjected to mesa-etching process, both sides of the collector layer 130 are etched through overetching process thereby to form a collapsed region 132. A collector electrode 135 is then formed on an epitaxial layer 125. Finally, the resulting structure is subjected to isolation mesa-etching process.

The above mentioned overetching process has been developed by Michigan University in U.S.A., etc. First, the process defines the emitter layer 150 and the base layer 140. Then, it uses a high rate of selective etching characteristic to the collector layer 130 of the base layer to over-etch into the inner side of the collector layer 130, so that it can reduce the effective base-collector junction capacitance. This method greatly affects the device characteristics depending on the repeatability and uniformity of the process.

FIG. 3 is a cross-sectional view showing a third embodiment of a conventional heterojunction bipolar transistor.

First, a buffer layer 210 is formed on a semiconductor substrate 200. Then, a subcollector layer 220, a collector layer 230, a base layer 240, an emitter layer 250 and an emitter cap layer 260 are sequentially grown on the buffer layer 210 to form a HBT epitaxial structure. After an emitter electrode 265 is formed at a selected region on the HBT epitaxial substrate, the selected region on the emitter cap layer 260 and the emitter layer 250 is subjected to mesa-etching process. Then, an insulating area 232 is formed at a selected region on the base layer 240 and the collector layer 230 through impurity injection process using the emitter electrode 265 as a mask. After a base electrode 255 is then formed at a selected region on the insulating area 232, the selected region is subjected to mesa-etching process. Then, a collector electrode 235 is selectively formed on the subcollector layer 220. The resulting structure is subjected to isolation mesa-etching process.

The above mentioned ion implantation isolating technology is one that accelerates proton ion $H^+$, helium ion $He^+$, boron ion $B^+$, etc. with a high level of energy into an external base layer into which p-type impurity of high concentration is doped and an external collector layer into which n-type impurity is doped, using the emitter electrode 265 as a mask, so that the region 232 within which electrical channels are disrupted can be defined. Since this method has its purpose to significantly reduce the effective junction capacitance between the base layer 240 and the collector layer 230, it can make a significant advance in view of research and development. However, it requires activation thermal process for restoring the damage of the surface of the base layer 240 in order to deposit the base electrode 235. Therefore, since this method may destruct a abrupt junction of the entire epitaxial structure, there is a great danger in adopting as a practical application.

FIG. 4 is a cross-sectional view showing a fourth embodiment of a conventional heterojunction bipolar transistor.

First, a buffer layer 310 is formed on a semiconductor substrate 300. Then, a subcollector layer 320, a collector layer 330, a base layer 340, an emitter layer 350 and an emitter cap layer 360 are sequentially grown on the buffer layer 310 to form a HBT epitaxial structure. After an emitter electrode 365 is formed at a selected region on the HBT epitaxial substrate, the selected region on the emitter cap layer 360 and the emitter layer 350 is subjected to mesa-etching process. Next, after a side wall silicon oxide film 342 is formed on both side walls of the emitter cap layer 360 and the emitter layer 350, an external base regrowth process is used to reduce the junction capacitance between the base and the collector. After a regrowth base layer 345 is formed on the base layer 340, a base electrode 355 is formed at a selected region on the regrowth base layer 345. Then, the selected region on the regrowth layer 345, the base layer 340 and the collector layer 330 are subjected to mesa-etching process. Then, a collector electrode 335 is formed at a selected region on the subcollector layer 320 and is then subjected to isolation mesa-etching process.

In case of the external base regrowth, there are a planar regrowth method and a lateral regrowth method. The purpose of regrowth is to reduce the base resistance by increasing the doping concentration to about $10^{20}$~$10^{21}$cm$^{-3}$ in addition to intrinsic base and by thickening the thickness of the base. The planar regrowth method can produce an electrode contact structure having a good flatness and forces the regrown base layer 345 to act as a contact layer since it is located between the base electrode 355 and a conventional base layer 340. The lateral regrowth method can produce a structure in which the regrown base layer 342 contacts the lateral side of the intrinsic base while acting as an external base. However, these methods are effective to lower the base resistance, but they are not so effective to lower the base-collector capacitance.

SUMMARY OF THE INVENTION

Therefore, it is an object of the present invention to solve the problems involved in the prior technologies, and to provide a method of manufacturing a heterojunction bipolar transistor which is capable of improve a high speed and high frequency characteristic of devices, by greatly improving junction capacitance between the base and the emitter which greatly affects an electric characteristic, i. e, a maximum oscillation frequency $f_{max}$.

To achieve the above object, the method of manufacturing a heterojunction bipolar transistor is characterized in that it includes the steps of forming sequentially a buffer layer, a subcollector layer, a collector layer, a base layer, an emitter layer and an emitter cap layer on a semiconductor substrate; forming an emitter electrode on a selected region of the emitter cap layer; performing etching process for forming a pattern by exposing the selected region of the base layer, and forming a polyimide layer on both side walls of the patternized emitter cap layer and the emitter layer; forming a base electrode on a selected region of the exposed base layer; performing etching process for forming a pattern by exposing some portions of the collector layer, and then forming a p-SiN film on both side walls of the patterned base layer and some portions of the collector layer; exposing some portions of the collector layer, etching the remaining collector layer and some portions of the subcollector layer with a inward slope, and then forming a collector electrode at a selected region of the remaining subcollector layer; and performing a thermal treatment process to make some of the collector layer and the subcollector layer into a P-N isolation region.

BRIEF DESCRIPTION OF THE DRAWINGS

The above object, and other features and advantages of the present invention will become more apparent by describing the preferred embodiment thereof with reference to the accompanying drawings, in which.

Similar reference characters refer to similar parts in the several views of the drawings.

DETAILED DESCRIPTION OF PREFERRED EMBODIMENT

One preferred embodiment of the present invention will be now explained in detail by reference to the accompanying drawings.

FIGS. 5A through 5L are cross-sectional views for explaining a method of manufacturing a heterojunction bipolar transistor according to one embodiment of the present invention.

Figure 1:
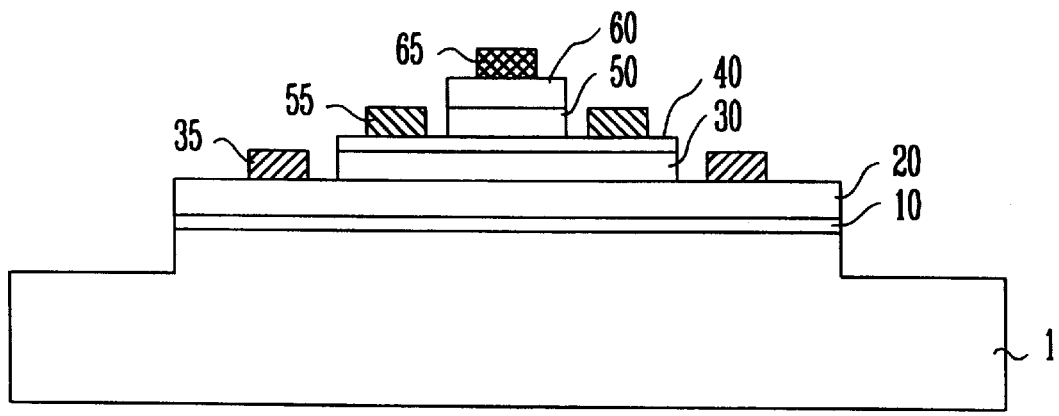
FIG. 1 is a cross-sectional view showing a first embodiment of a conventional heterojunction bipolar transistor.
Figure 2:
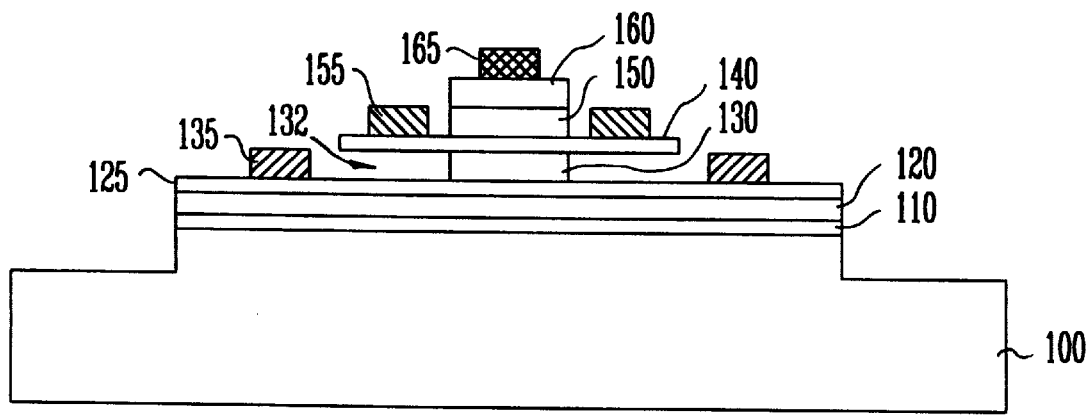
FIG. 2 is a cross-sectional view showing a second embodiment of a conventional heterojunction bipolar transistor.
Figure 3:
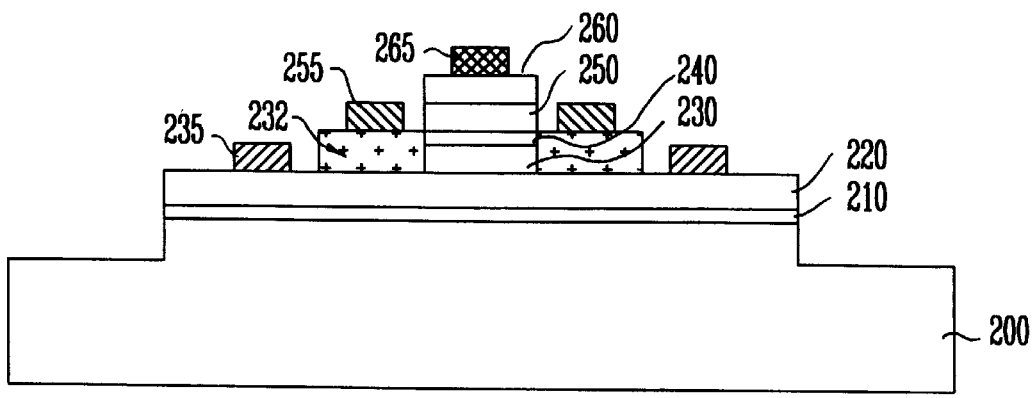
FIG. 3 is a cross-sectional view showing a third embodiment of a conventional heterojunction bipolar transistor.
Figure 4:
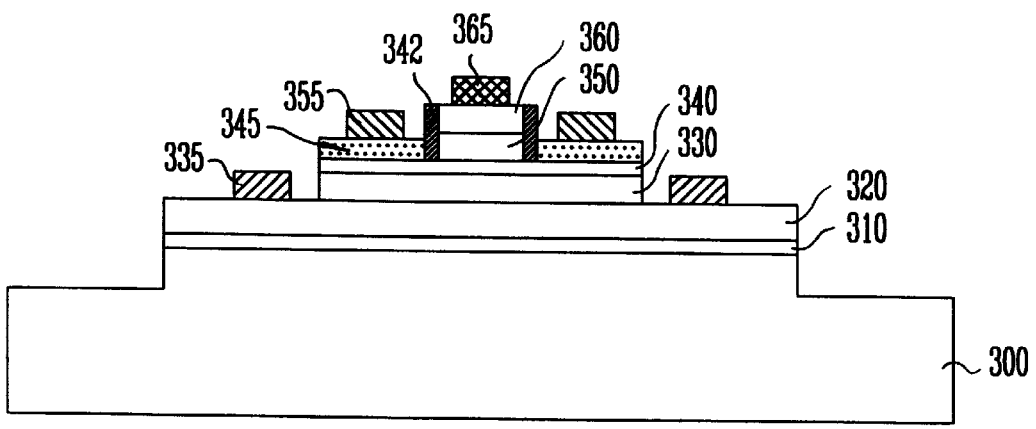
FIG. 4 is a cross-sectional view showing a fourth embodiment of a conventional heterojunction bipolar transistor.
Figure 5A:
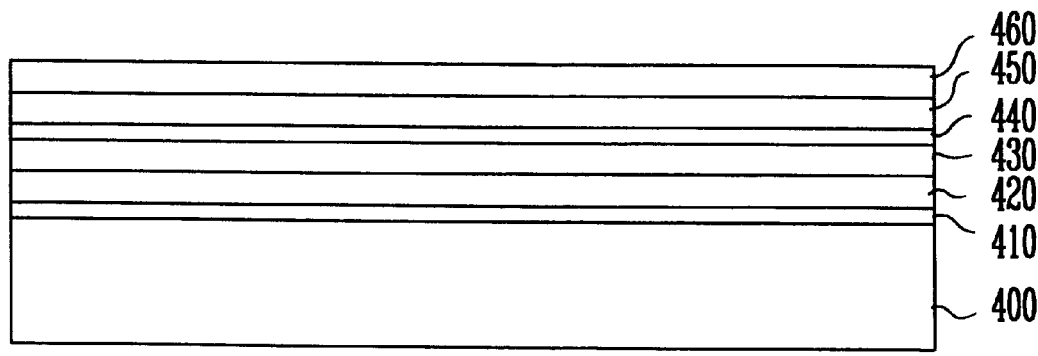
FIGS. 5A through 5L are cross-sectional views for explaining a method of manufacturing a heterojunction bipolar transistor according to one embodiment of the present invention.

Referring now to FIG. 5A, a buffer layer 410 is grown on a semiconductor substrate 400. Then, a subcollector layer 420, a collector layer 430, a base layer 440, an emitter layer 450 and an emitter cap layer 460 are sequentially deposited on the buffer layer 410 thereby a HBT epitaxial structure is formed.

The semiconductor substrate 400 is made of compound semiconductor substrate having an electrically semi-insulating property. The HBT epitaxial substrate may be manufactured by means of various growth methods such as molecular beam epitaxy (MBE), metal-organic chemical vapor deposition (MOCVD), etc. This invention uses a n-p-n HBT structure which n-type impurity is doped into the emitter layer 450 and the collector layer 430, and P-type impurity is doped into the base layer 440.

Figure 5B:
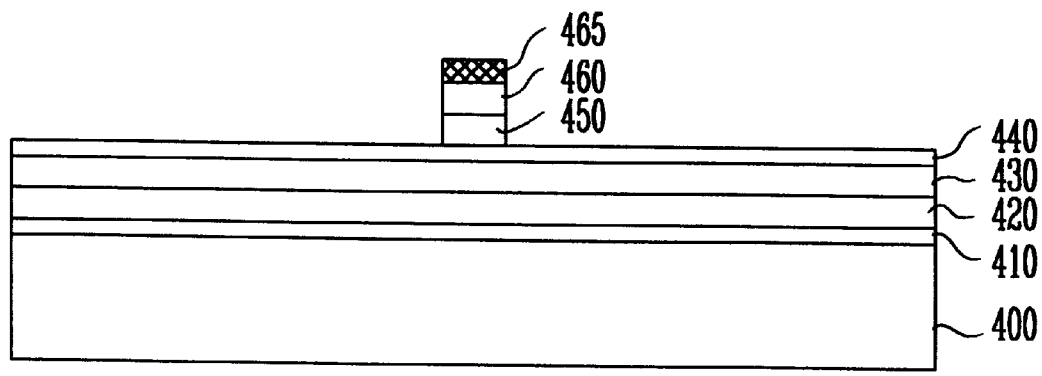

Referring to FIG. 5B, an emitter electrode 465 is formed at a selected region on the emitter cap layer 460. Through wet mesa etching using the emitter electrode 465 as a mask, the emitter cap layer 460 and the emitter layer 450 are sequentially etched to expose the base layer 440.

At this time, it is preferred that the emitter electrode 465 be made of refractory metal materials such as tungsten W, tungsten silicide WSi, tungsten nitride WN, etc. The reason is that the emitter electrode can resist high thermal treatment which is performed to diffuse zinc as a P-type dopant laterally into the collector layer 430.

Figure 5C:
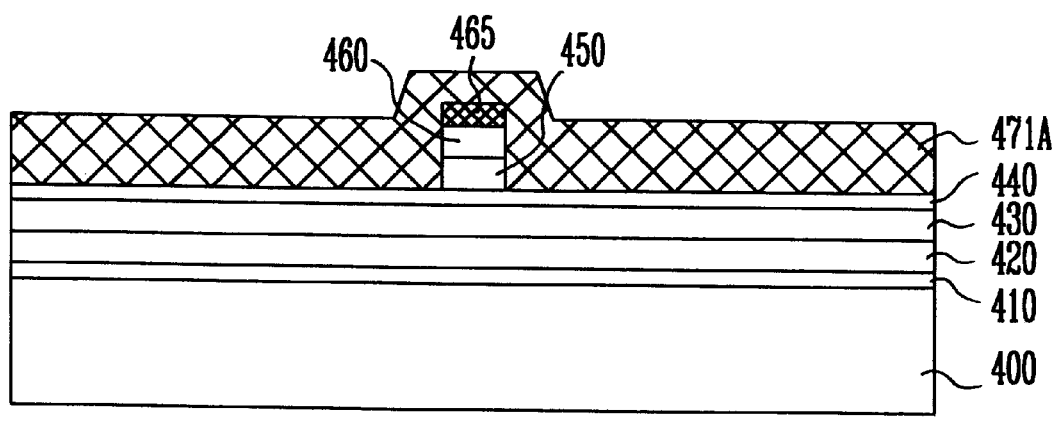

By reference to FIG. 5C, a polyimide protection film 471A of 1 to 3 µm is covered on the entire structure which include the emitter electrode 465, the emitter cap pattern 460, the emitter pattern 450 and the base layer 440.

Figure 5D:
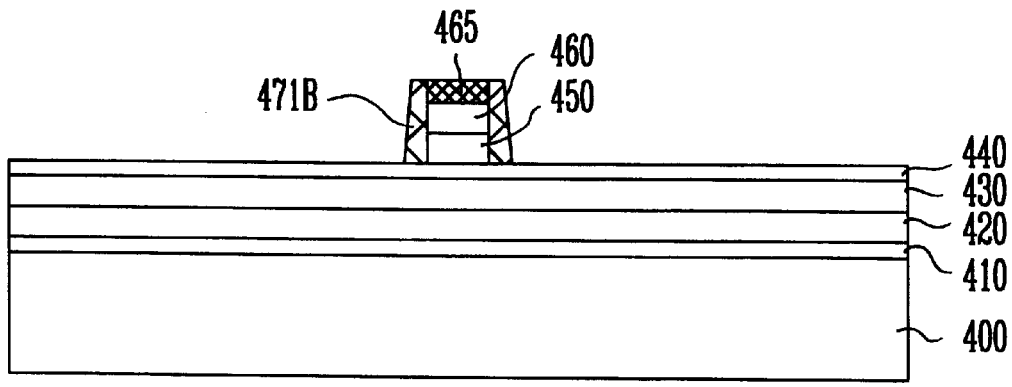

Referring to FIG. 5D, a polyimide film 471B is formed around the emitter mesa region on the entire structure using a reactive ion etching (RIE) method.

The reactive ion etching method is an etching method having a greatly anisotropic property, wherein it performs etching process by generating $O_2$ plasma until the protection layer 471A on the surfaces of the emitter electrode 465 and the base layer 440 is removed therefrom.

Figure 5E:
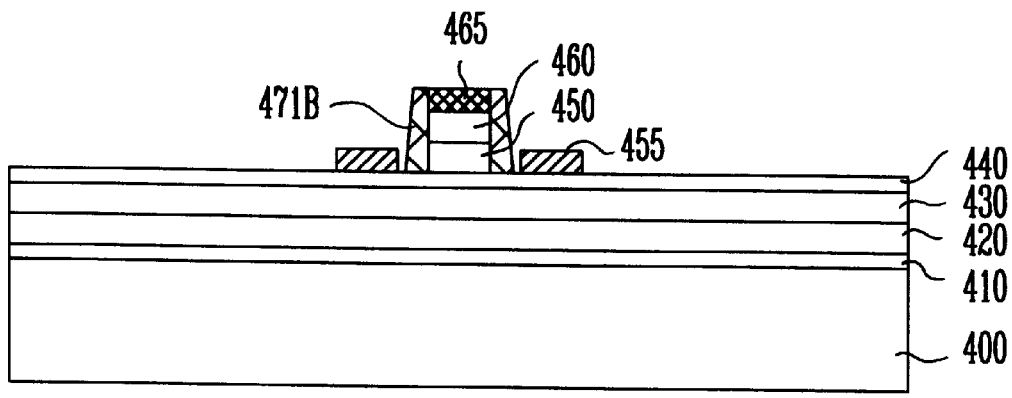
Figure 5F:
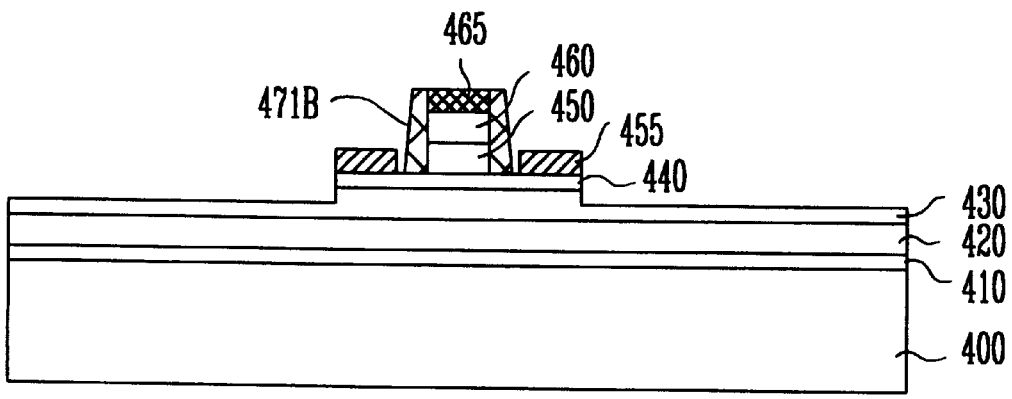

Referring to FIGS. 5E through 5F, a base electrode 455 is formed at a selected region on the base layer 440 at both sides of the polyimide film 471B. In order to remain some of the collector layer 430, selected portions of the base layer 440 and the collector layer 430 are sequentially etched through mesa etching process.

The polyimide film 471B functions both to induce the base electrode 455 made of refractory metal to be formed on the base layer 440 in self-alignment way when depositing the base electrode 455, and in the following process, to protect the emitter cap layer 460 and the emitter layer 450 from being doped when inducing zinc to diffuse into the collector layer 430.

Figure 5G:
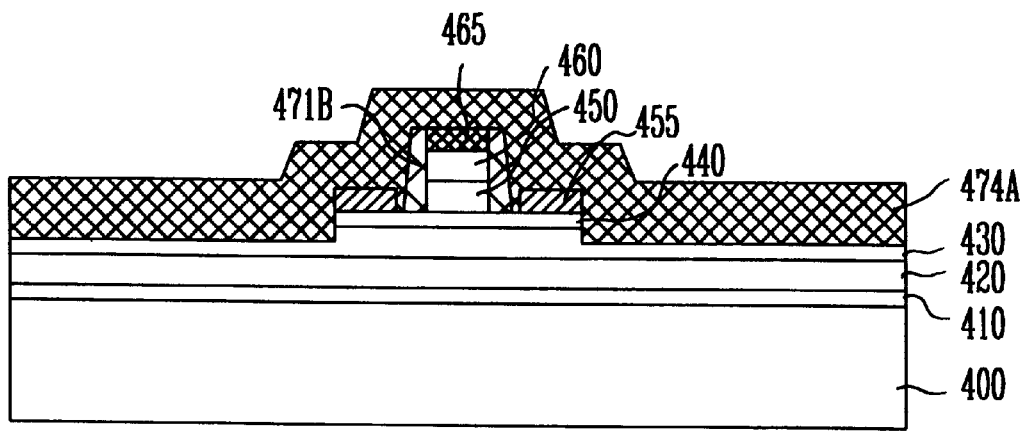

Referring to FIG. 5G, through electronic cyclotron resonance (ECR) chemical vapor deposition (CVD) method, a SiN film 474A highly doped with zinc is deposited with 1 to 3 µm thickness on the entire structure in which some of the collector layer 430 are exposed.

In more detail, as in a commonly employed method using ECR-CVD equipment which can induce a high plasma density while using a low ion energy, the present method first injects nitrogen $N_2$ into a cavity resonator of a plasma discharge chamber and then supplies $SiH_4$ by use of a gas injector into the reactive chamber in which a substrate is positioned. As one of the characteristic methods of the present invention, after diethyl zinc (DEZn) being a source of zinc is injected into the reactive chamber through another gas injector, if microwave supply power of 2.5 GHz and magnetic field of 875 Gauss are applied thereto, zinc can be injected as impurity during deposition of SiN film 474A. At this time, unlike the ECR-CVD method which commonly uses a room temperature deposition, the present method maintains the temperature of the substrate to about 200 to 300° C. so that doping into the SiN film 474A of zinc can be activated.

Figure 5H:
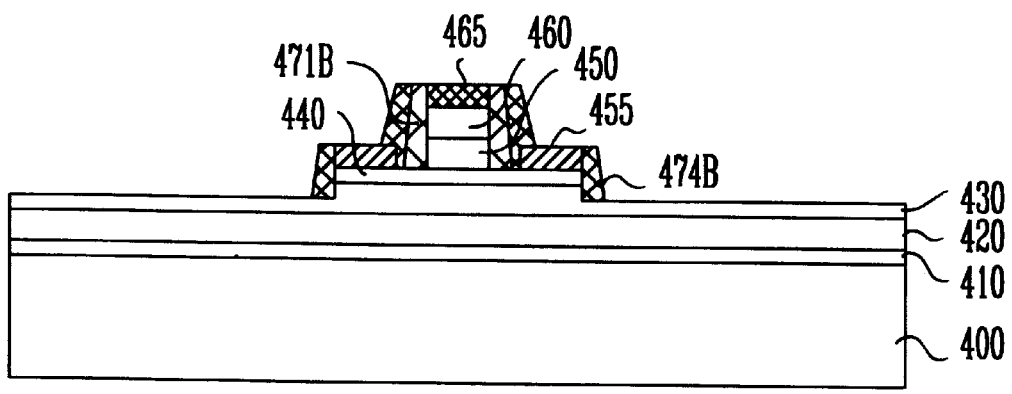

Referring to FIG. 5H, through anisotropic dry etching method using Freon gas, a p-SiN film 474B doped with zinc is formed on both side walls of the polyimide film 471B, and the base electrode 455, the base pattern 440 and the collector pattern 430.

At this time, the polyimide film 471B effectively prevents zinc from diffusing into the emitter layer 450 during the subsequent thermal treatment process for diffusing zinc onto the collector layer 430.

Figure 5I:
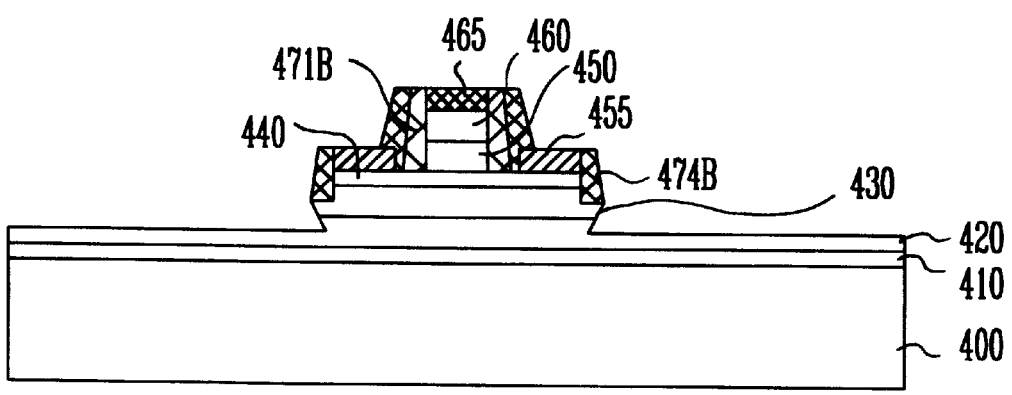
Figure 5J:
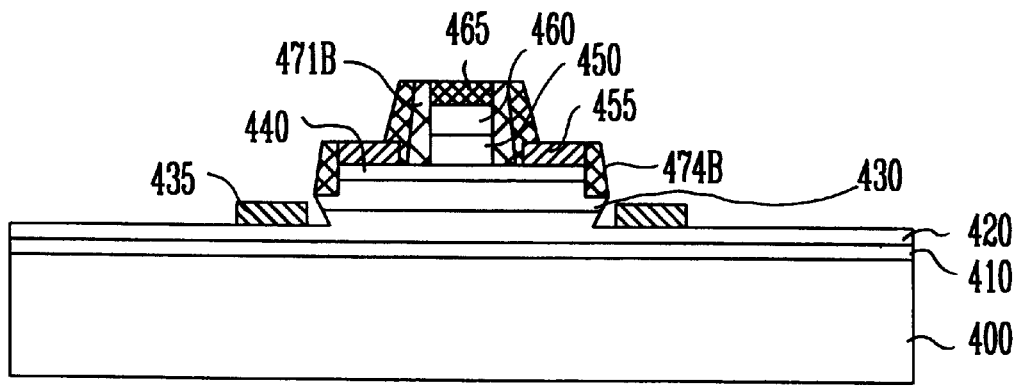
Figure 5K:
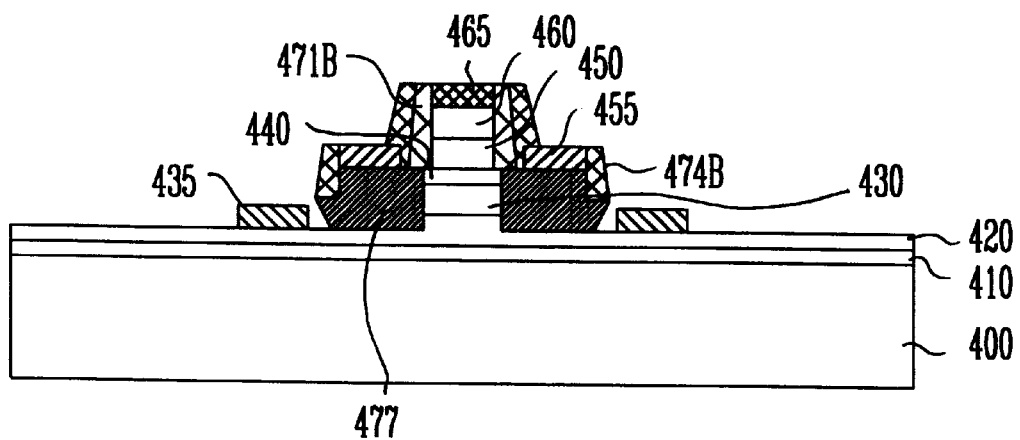

Referring now to FIGS. 5I and 5J, some selected portions of the remaining collector layer 430 and the subcollector 420 are etched to form a inward slope through mesa etching process. A collector electrode 435 is then formed at a selected region on the exposed subcollector layer 420 in a self-alignment manner with respect to the base layer 440.

The reason why the collector layer 430 and the subcollector layer 420 are formed with a reverse slant is to prevent zinc from diffusing into the entire surfaces of the collector layer 420 during subsequent thermal treatment process as well as to assist a self alignment of the collector electrode 435.

Referring to 5K, a collector electrode 435 shows ohmic characteristic through activation process. And simultaneously, an insulating region 477 are formed on a selected region of the collector layer 430 and the subcollector layer 420 due to diffusion of zinc into lateral direction through the p-SiN film 474B.

Such method can significantly reduce effective junction capacitance by injecting p-type impurity (zinc, etc.) which can offset the n-type impurity of the conventional collector layer 430 or the subcollector layer 420 into an external base region.

Figure 5L:
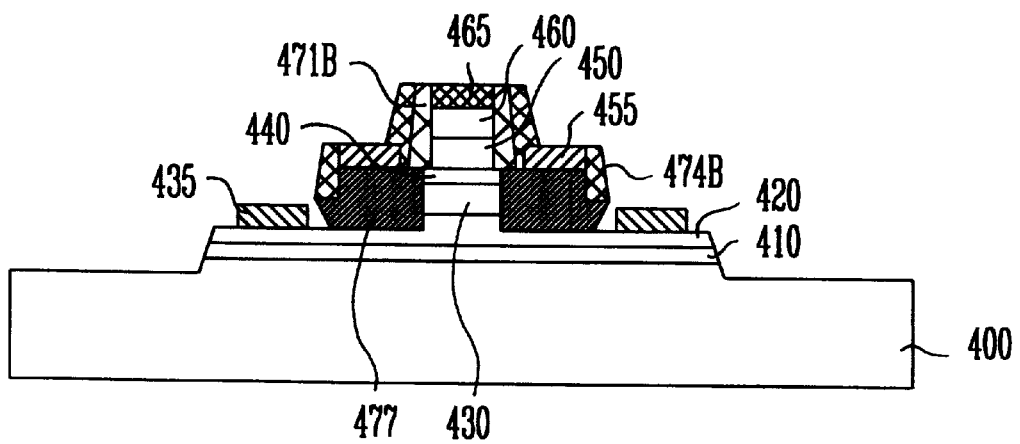

Referring to FIG. 5L, selected regions of the subcollector layer 420, the buffer layer 410 and the semiconductor substrate 400 are etched by means of mesa etching process for electrical isolation between the elements. A dielectric insulating film is then deposited on the entire surfaces of the structure, a contact window for metal connection is opened on the emitter electrode 465, the base electrode 455 and the collector electrode 435 and a metal wiring is formed thereon. Thus, the HBT device with higher speed and frequency according to the present invention is manufactured.

Digital and analog application circuits using the HBT devices composed of compound semiconductor have been actively applied to the field of various information and communication systems such as a satellite communication system, a very high speed wideband optical communication system, and LMDS (local multipoint distribution service), etc. Major interest in manufacturing this HBT device and circuit having a high value-added characteristic is made to maximize and stabilize their performances. Especially, implementing reliably the device to be high speed and high frequency characteristics as communication components is extremely important.

As described above, the present invention provides the advantages in that it can make a technical contribution in implementing a very speed characteristic and also make possible an efficient manufacture process compared to a conventional manufacture process, by greatly improving the junction capacitance between the emitter layer and the base layer which greatly affects the maximum oscillation frequency of the HBT.

While the present invention has been described and illustrated herein with reference to the preferred embodiment thereof, it will be understood by those skilled in the art that various changes in form and details may be made therein without departing from the spirit and scope of the invention.

What is claimed is:

1. A method of manufacturing a heterojunction dipole device, comprising the steps of:
   forming sequentially a buffer layer, a subcollector layer, a collector layer, a base layer, an emitter layer and an emitter cap layer on a semiconductor substrate;
   forming an emitter electrode on a selected region of said emitter cap layer;

performing etching process for forming a pattern by exposing said selected region of said base layer, and forming a polyimide layer on both side walls of the patternized emitter cap layer and said emitter layer;

forming a base electrode on a selected region of said exposed base layer;

performing etching process for forming a pattern by exposing some portions of said collector layer, and then forming a p-SiN film on both side walls of said patterned base layer and some portions of the collector layer;

exposing some portions of said collector layer, etching the remaining collector layer and some portions of said subcollector layer with a inward slope, and then forming a collector electrode at a selected region of the remaining subcollector layer; and performing a thermal treatment process to make some of said collector layer and said subcollector layer into an insulating region.

2. A method of manufacturing a heterojunction bipolar device as claimed in claim 1, wherein said emitter layer and said collector layer are doped with n-type impurity, and said base layer is doped with p-type impurity.

3. A method of manufacturing a heterojunction bipolar device as claimed in claim 1, wherein said emitter layer is made of one of tungsten, tungsten silicide and tungsten nitride.

4. A method of manufacturing a heterojunction bipolar device as claimed in claim 1, wherein said polyimide side wall film is formed by means of reactive ion etching method with a great anisotropic property after forming a polyimide film in thickness of 1 to 3 $\mu$m.

5. A method of manufacturing a heterojunction bipolar device as claimed in claim 1, wherein said p-SiN film is formed in thickness of 1 to 3 $\mu$m with zinc of high doping concentration.

6. A method of manufacturing a heterojunction bipolar device including an emitter, a base and a collector, comprising the steps of:

forming a zinc-doped p-SiN film on both side walls of said base and collector layers; and making some of said collector layer into an insulating region so as to reduce the base-collector junction capacitance by means of a thermal treatment process.

* * * * *